US009825196B2

(12) United States Patent
Wang et al.

(10) Patent No.: US 9,825,196 B2
(45) Date of Patent: Nov. 21, 2017

(54) MICROCRYSTALLINE SILICON THIN FILM SOLAR CELL AND THE MANUFACTURING METHOD THEREOF

(71) Applicant: Institute of Nuclear Energy Research Atomic Energy Council, Executive Yuan, Taoyuan County (TW)

(72) Inventors: Min-Chuan Wang, Taoyuan County (TW); Tian-You Liao, Taoyuan County (TW); Chih-Pong Huang, Taoyuan County (TW); Der-Jun Jan, Taoyuan County (TW)

(73) Assignee: INSTITUTE OF NUCLEAR ENERGY RESEARCH ATOMIC ENERGY COUNCIL, EXECUTIVE YUAN, Taoyuan County (TW)

( * ) Notice: Subject to any disclaimer, the term of this patent is extended or adjusted under 35 U.S.C. 154(b) by 111 days.

(21) Appl. No.: 14/644,486

(22) Filed: Mar. 11, 2015

(65) Prior Publication Data
US 2015/0200325 A1    Jul. 16, 2015

Related U.S. Application Data

(62) Division of application No. 13/836,546, filed on Mar. 15, 2013, now abandoned.

(30) Foreign Application Priority Data

Oct. 12, 2012 (TW) .............................. 101137752 A

(51) Int. Cl.
H01L 31/00        (2006.01)
H01L 31/18        (2006.01)
(Continued)

(52) U.S. Cl.
CPC .... *H01L 31/1824* (2013.01); *H01L 31/03921* (2013.01); *H01L 31/077* (2013.01); *H01L 31/1804* (2013.01); *H01L 31/1816* (2013.01); *H01L 31/1884* (2013.01); *Y02E 10/547* (2013.01); *Y02P 70/521* (2015.11)

(58) Field of Classification Search
CPC .................................................. H01L 31/1824
See application file for complete search history.

(56) References Cited

U.S. PATENT DOCUMENTS 7,919,398 B2     4/2011  Chae et al.
2001/0031541 A1* 10/2001 Madan ................ C23C 16/4583
                                                          438/482
(Continued)

FOREIGN PATENT DOCUMENTS

WO    WO2012043304    4/2012

*Primary Examiner* — Robert A Vetere
(74) *Attorney, Agent, or Firm* — WPAT, PC

(57) ABSTRACT

The present invention relates to a microcrystalline silicon thin film solar cell and the manufacturing method thereof, using which not only the crystallinity of a microcrystalline silicon thin film that is to be formed by the manufacturing method can be controlled and adjusted at will and the defects in the microcrystalline silicon thin film can be fixed, but also the device characteristic degradation due to chamber contamination happening in the manufacturing process, such as plasma enhanced chemical vapor deposition (PECVD), can be eliminated effectively.

6 Claims, 2 Drawing Sheets

(51) Int. Cl.
*H01L 31/077* (2012.01)
*H01L 31/0392* (2006.01)

(56) References Cited

U.S. PATENT DOCUMENTS

| | | | |
|---|---|---|---|
| 2001/0037823 A1* | 11/2001 | Middelman | H01L 31/0392 |
| | | | 136/251 |
| 2004/0020601 A1* | 2/2004 | Zhao | H01L 21/02126 |
| | | | 156/345.32 |
| 2007/0298590 A1 | 12/2007 | Choi et al. | |
| 2008/0173350 A1* | 7/2008 | Choi | H01L 31/18 |
| | | | 136/258 |
| 2009/0020154 A1* | 1/2009 | Sheng | H01L 31/03685 |
| | | | 136/255 |
| 2009/0023241 A1* | 1/2009 | Furuta | B08B 7/0035 |
| | | | 438/57 |
| 2009/0130337 A1* | 5/2009 | Ovshinsky | C23C 16/24 |
| | | | 427/575 |
| 2009/0263930 A1* | 10/2009 | Chae | H01L 31/075 |
| | | | 438/96 |
| 2011/0048533 A1 | 3/2011 | Lee et al. | |
| 2011/0203652 A1 | 8/2011 | Tsai | |
| 2011/0312121 A1 | 12/2011 | Yamazaki | |
| 2012/0211069 A1 | 8/2012 | Yun et al. | |
| 2013/0203203 A1 | 8/2013 | Uenomachi et al. | |

* cited by examiner

MICROCRYSTALLINE SILICON THIN FILM SOLAR CELL AND THE MANUFACTURING METHOD THEREOF

CROSS-REFERENCE TO RELATED APPLICATIONS

This application is a divisional application of co-pending U.S. application Ser. No. 13/836,546, filed on Mar. 15, 2013, which claims the priority to Taiwan Patent Application No. 101137752 filed in the Taiwan Patent Office on Oct. 12, 2012, which is herein incorporated by reference in its entirety.

FIELD OF THE INVENTION

The present invention relates to a thin film and a method for manufacturing a thin film device, and more particularly, to a microcrystalline silicon thin film solar cell and the manufacturing method thereof.

BACKGROUND OF THE INVENTION

Global warming is the rise in the average temperature of Earth's atmosphere and oceans since the late 19th century that it is primarily caused by increasing concentrations of greenhouse gases produced by human activities such as the burning of fossil fuels and deforestation. Recently, warming of the climate system is unequivocal and has become perhaps the most complicated issue facing world leaders. Thus, there are more and more clean energy projects being proposed and developed, and among which, solar cells for converts light energy into electrical energy are most promising since the photovoltaic process will not releases any $CO_2$, $SO_2$, or $NO_2$ gases which don't contribute to global warming. Moreover, Building-integrated photovoltaics (BIPV), which are photovoltaic materials used to replace conventional building materials in parts of the building envelope such as the roof, skylights, or facades, are increasingly being incorporated into the construction of new buildings. The use of BIPV had increased by 48.7% from 181.6 MW at Year 2009 to 270.1 MW at Year 2010, and at Year 2011, it had increased by 60% to 433 MW. In addition, the BIPV market is expended to grow continuously to 1867.5 MW at Year 2015, which is more than 10 times the amount of BIPV used at Year 2009. According to EPIA, at Year 2020, the total production of solar energy can reach 139 billion Euros. Nevertheless, since both solar power industry and semiconductor industry need to use a lot of silicon material, the shortage of silicon material is inevitable and expected. Consequently, thin film solar cells which can be formed in a thickness less than several nanometers are expected to become the star-product in solar power industry. In recent years, there are many means of plasma-enhanced chemical vapor deposition (PECVD) being developed to be used for manufacturing large area thin film silicon solar cells. Generally, a common thin film cell is a three-layered P-I-N structure that is composed of a layer of intrinsic semiconductor sandwiched between a layer of hole-based silicon semiconductor, such as a p-type Si, and a layer of electron-based silicon semiconductor, such as a n-type Si, whereas such three-layered thin film solar cells are formed by a PECVD means. Moreover, it is noted that microcrystalline silicon has been recognized as useful thin-film semiconductor for solar cells since the efficiency of such thin film solar cell can be greatly enhanced thereby.

SUMMARY OF THE INVENTION

Conventionally, for producing high quality microcrystalline silicon thin film with high deposition rate, a means of VHF plasma-enhanced process of high processing pressure and high plasma power is developed and used. However, the device characteristic degradation due to chamber contamination and defected thin film deposition is almost inevitable in such high processing pressure and high plasma power manufacturing process.

Therefore, it is intended to develop a manufacturing process capable of preventing the aforesaid problems of chamber contamination and defected thin film deposition, while without causing any increasing in overall manufacture cost.

Accordingly, the manufacturing method of the present invention should have the following characteristics:
(1) It is a novel microcrystalline silicon thin film solar cell and the manufacturing method thereof.
(2) By forming multiple layers of microcrystalline silicon thin film respectively in different chambers using different plasma sources, the quality of so-achieved microcrystalline silicon thin film is improved.
(3) It is a manufacturing method capable of effectively eliminating device characteristic degradation due to chamber contamination happening in the manufacturing process.

In an exemplary embodiment, the present invention provides a method for manufacturing a microcrystalline silicon thin film solar cell, which comprises the steps of: using a means of physical vapor deposition (PVD) to form a layer of transparent conducting oxide (TCO) and thus define a pattern on a substrate; using a means of plasma-enhanced chemical vapor deposition (PECVD) to form a layer of hole-based silicon semiconductor, such as a p-type Si, on the layer of TCO in a first process chamber while enabling the layer of hole-based silicon semiconductor to be used as a hole-based ohmic contact layer; using a means of plasma-enhanced chemical vapor deposition (PECVD) to form a first layer of intrinsic microcrystalline silicon semiconductor, such as a μ-Si, on the layer of hole-based silicon semiconductor in the first process chamber while enabling the first layer of intrinsic microcrystalline silicon semiconductor to be used as a light absorption layer; using a means of plasma-enhanced chemical vapor deposition (PECVD) under a condition of high processing pressure and high plasma power to form a second layer of intrinsic microcrystalline silicon semiconductor, such as a μ-Si, on the first layer of intrinsic microcrystalline silicon semiconductor in a second process chamber while enabling the second layer of intrinsic microcrystalline silicon semiconductor to be used also as a light absorption layer; using a means of plasma-enhanced chemical vapor deposition (PECVD) to form a third layer of intrinsic microcrystalline silicon semiconductor, such as a μ-Si, on the second layer of intrinsic microcrystalline silicon semiconductor in a third process chamber while enabling the second layer of intrinsic microcrystalline silicon semiconductor to be used also as a light absorption layer; using a means of plasma-enhanced chemical vapor deposition (PECVD) to form a layer of electron-based silicon semiconductor, such as a n-type Si, in a pattern on the third layer of intrinsic microcrystalline silicon semiconductor in the third process chamber while enabling the layer of electron-based silicon semiconductor to be used also as an electron-based ohmic contact layer; and using a means of physical vapor deposition (PVD) to form a conductive metal layer in a pattern on the layer of electron-based silicon semiconductor while enabling the conductive metal layer to be used as a back electrode, and thereby, achieving a P-I-N structure.

In another exemplary embodiment, the present invention provides a microcrystalline silicon thin film solar cell, which comprises: a substrate, being used as the bottom layer of the microcrystalline silicon thin film solar cell; a layer of transparent conducting oxide (TCO), disposed on the substrate; a layer of hole-based silicon semiconductor, such as a p-type Si, disposed on the layer of TCO; a first layer of intrinsic microcrystalline silicon semiconductor, such as a μ-Si, disposed on the layer of hole-based silicon semiconductor; a second layer of intrinsic microcrystalline silicon semiconductor, such as a μ-Si, disposed on the first layer of intrinsic microcrystalline silicon semiconductor; a third layer of intrinsic microcrystalline silicon semiconductor, such as a μ-Si, disposed on the second layer of intrinsic microcrystalline silicon semiconductor; a layer of electron-based silicon semiconductor, such as a n-type Si, disposed on the third layer of intrinsic microcrystalline silicon semiconductor; and a conductive metal layer, disposed on the layer of electron-based silicon semiconductor.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

The present invention relates to a novel microcrystalline silicon thin film solar cell and the manufacturing method thereof, which is capable of effectively preventing chamber contamination during film deposition from happening in the high processing pressure and high plasma power PECVD process, and simultaneously enabling the multiple layers of microcrystalline silicon thin film respectively in different chambers using different plasma sources while allowing the crystallinity as well as the structure of a microcrystalline silicon thin film that is to be formed by the manufacturing method to be controlled and adjusted at will.

Figure 3:
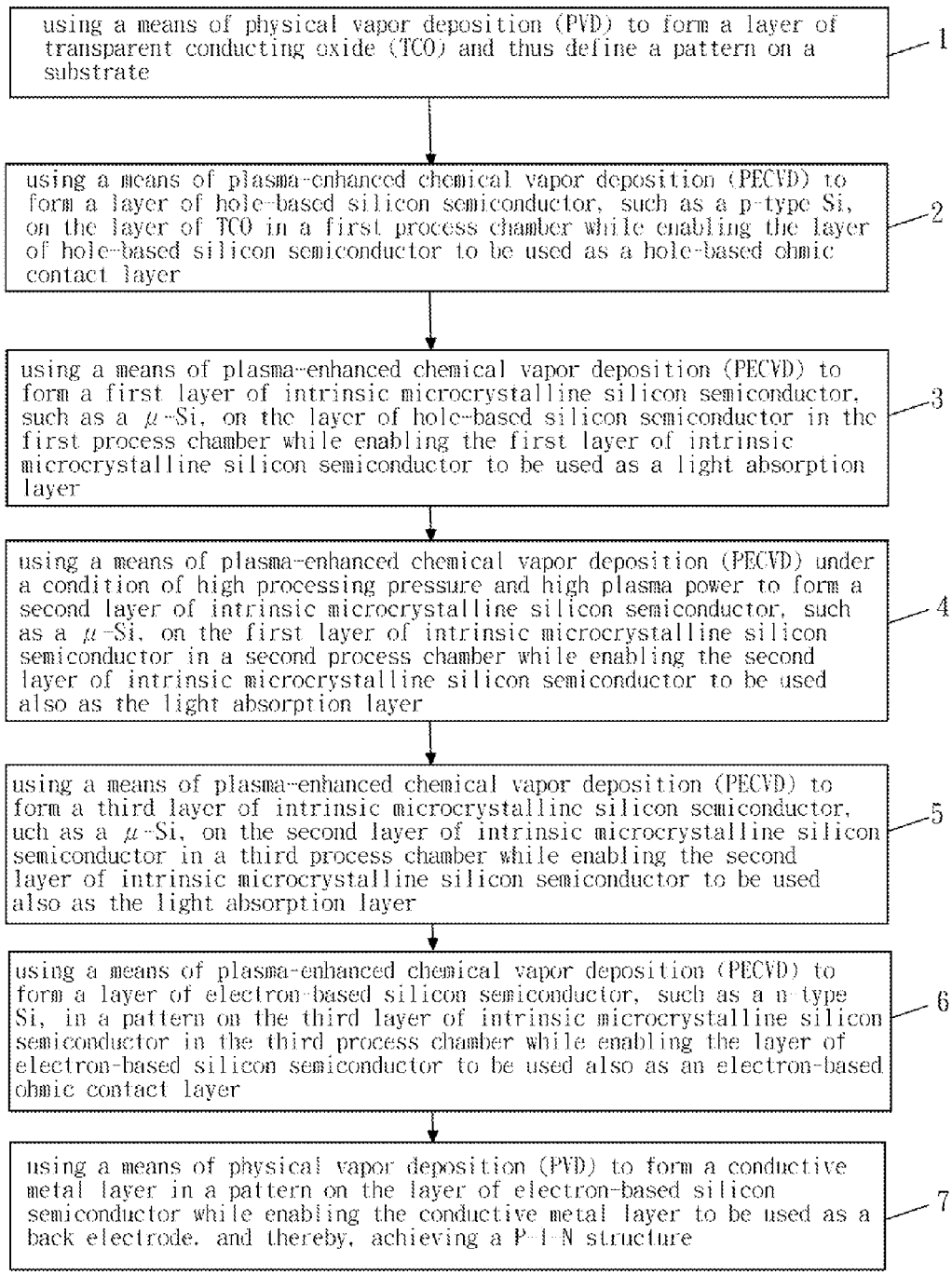
FIG. 3 is a flow chart showing the steps performed in a manufacturing method of the present invention.

Please refer to FIG. 3, which is a flow chart showing the steps performed in a manufacturing method of the present invention. As shown in FIG. 3, the manufacturing method of the present invention comprises the steps of: using a means of physical vapor deposition (PVD) to form a layer of transparent conducting oxide (TCO) 21 and thus define a pattern on a substrate 20; using a means of plasma-enhanced chemical vapor deposition (PECVD) to form a layer of hole-based silicon semiconductor 22, such as a p-type Si, on the layer of TCO 21 in a first process chamber 11 while enabling the layer of hole-based silicon semiconductor 22 to be used as a hole-based ohmic contact layer; using a means of plasma-enhanced chemical vapor deposition (PECVD) to form a first layer of intrinsic microcrystalline silicon semiconductor 23, such as a μ-Si, on the layer of hole-based silicon semiconductor 22 in the first process chamber 11 while enabling the first layer of intrinsic microcrystalline silicon semiconductor 23 to be used as a light absorption layer; using a means of plasma-enhanced chemical vapor deposition (PECVD) under a condition of high processing pressure and high plasma power to form a second layer of intrinsic microcrystalline silicon semiconductor 24, such as a μ-Si, on the first layer of intrinsic microcrystalline silicon semiconductor 23 in a second process chamber 12 while enabling the second layer of intrinsic microcrystalline silicon semiconductor 24 to be used also as a light absorption layer; using a means of plasma-enhanced chemical vapor deposition (PECVD) to form a third layer of intrinsic microcrystalline silicon semiconductor 25, such as a μ-Si, on the second layer of intrinsic microcrystalline silicon semiconductor 24 in a third process chamber 13 while enabling the second layer of intrinsic microcrystalline silicon semiconductor 25 to be used also as a light absorption layer; using a means of plasma-enhanced chemical vapor deposition (PECVD) to form a layer of electron-based silicon semiconductor 26, such as a n-type Si, in a pattern on the third layer of intrinsic microcrystalline silicon semiconductor 25 in the third process chamber 13 while enabling the layer of electron-based silicon semiconductor 26 to be used also as an electron-based ohmic contact layer; and using a means of physical vapor deposition (PVD) to form a conductive metal layer 27 in a pattern on the layer of electron-based silicon semiconductor 26 while enabling the conductive metal layer 27 to be used as a back electrode, and thereby, achieving a P-I-N structure.

Figure 2:
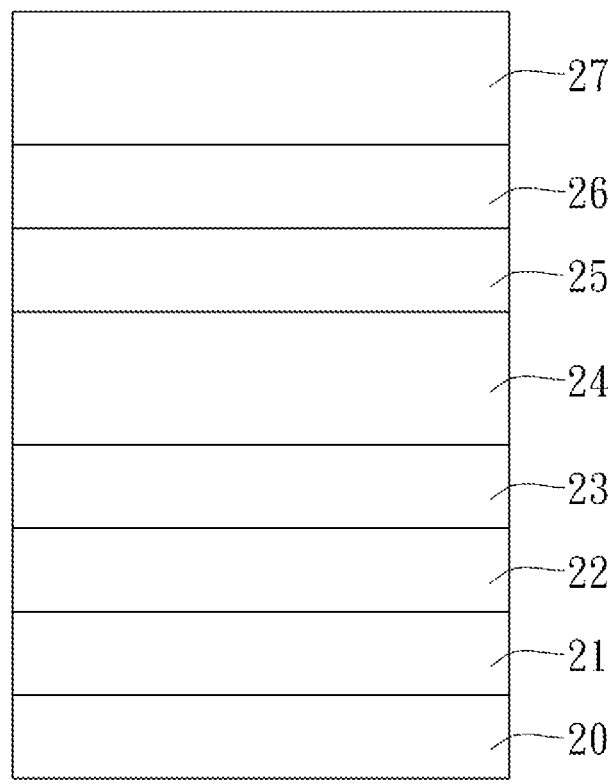
FIG. 2 is a schematic diagram showing a microcrystalline silicon thin film solar cell according to an embodiment of the invention.

Please refer to FIG. 2, which is a schematic diagram showing a microcrystalline silicon thin film solar cell according to an embodiment of the invention. As shown in FIG. 2, the means of PECVD in the first process chamber 11 is performed using a first plasma source, whereas the first plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz. Similarly, the means of PECVD in the second process chamber 12 is performed using a second plasma source; the second plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz; and the means of PECVD in the third process chamber 13 is performed using a third plasma source; the third plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz. Moreover, during the forming of the second layer of intrinsic microcrystalline silicon semiconductor 24 on the first layer of intrinsic microcrystalline silicon semiconductor 23 in the second process chamber 12 using the second plasma source, any defect in the first layer of intrinsic microcrystalline silicon semiconductor 23 is remedied and repaired for enhancing the quality of the resulting microcrystalline thin film. It is noted that the first layer of intrinsic microcrystalline silicon semiconductor 23 not only can be used as a light absorption layer, it can also be used for preventing chamber contamination from happening in the high pressure, high power manufacturing process. In addition, the substrate 20 is a substrate selected from the group consisting of: a glass and a flexible thermal-resistant substrate; and the first process chamber 11 is connected to the second process chamber 12, and the second process chamber 12 is connected to the third process chamber 13, while the third process chamber 13 is connected to a vacuumed load-lock chamber. It is noted that the load-lock chamber is being vacuumed after having a sample disposed therein, and then after to a specific degree of vacuum is reached, the sample is then ready to be transported for processing. Accordingly, the crystallinity of the layer of intrinsic microcrystalline silicon semiconductor that is to be formed in the manufacturing method can be adjusted and controlled so as to allow the layer of hole-based silicon semiconductor to be formed with higher energy gap (Eg).

Figure 1:
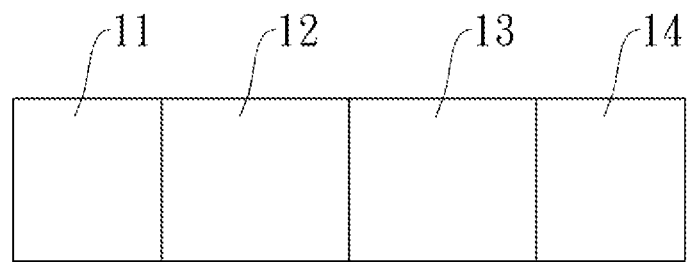
FIG. 1 is a schematic diagram showing a process chamber used in a manufacturing method of the present invention.

Please refer to FIG. 1, which is a schematic diagram showing a process chamber used in a manufacturing method of the present invention. As shown in FIG. 1, the present invention provides a microcrystalline silicon thin film solar cell, which comprises: a substrate 20, being used as the bottom layer of the microcrystalline silicon thin film solar cell; a layer of transparent conducting oxide (TCO) 21, disposed on the substrate 20; a layer of hole-based silicon semiconductor 22, such as a p-type Si, disposed on the layer of TCO 21; a first layer of intrinsic microcrystalline silicon semiconductor 23, such as a μ-Si, disposed on the layer of hole-based silicon semiconductor 22; a second layer of intrinsic microcrystalline silicon semiconductor 24, such as a μ-Si, disposed on the first layer of intrinsic microcrystalline silicon semiconductor 23; a third layer of intrinsic microcrystalline silicon semiconductor 25, such as a μ-Si, disposed on the second layer of intrinsic microcrystalline silicon semiconductor 24; a layer of electron-based silicon semiconductor 26, such as a n-type Si, disposed on the third layer of intrinsic microcrystalline silicon semiconductor 25; and a conductive metal layer 27, disposed on the layer of electron-based silicon semiconductor 26. It is noted that the layer of TCO 21 is formed in a pattern on the substrate 20 by a means of physical vapor deposition (PVD); the layer of hole-based silicon semiconductor 22 is formed on the layer of TCO 21 in the first process chamber 11 by a means of plasma-enhanced chemical vapor deposition (PECVD), and the layer of hole-based silicon semiconductor is used as a hole-based ohmic contact layer; the first layer of intrinsic microcrystalline silicon semiconductor 23 is formed on the layer of hole-based silicon semiconductor 22 in the first process chamber 11 by a means of plasma-enhanced chemical vapor deposition (PECVD), and the first layer of intrinsic microcrystalline silicon semiconductor 23 is used as a light absorption layer; the second layer of intrinsic microcrystalline silicon semiconductor 24 is formed on the first layer of intrinsic microcrystalline silicon semiconductor 23 in the second process chamber 12 by a means of plasma-enhanced chemical vapor deposition (PECVD) under a condition of high process pressure and high plasma power, and the second layer of intrinsic microcrystalline silicon semiconductor 24 is used as a light absorption layer; the third layer of intrinsic microcrystalline silicon semiconductor 25 is formed on the second layer of intrinsic microcrystalline silicon semiconductor 24 in the third process chamber 13 by a means of plasma-enhanced chemical vapor deposition (PECVD), and the third layer of intrinsic microcrystalline silicon semiconductor 25 is used as a light absorption layer; the layer of electron-based silicon semiconductor 26 is formed in a pattern on the third layer of intrinsic microcrystalline silicon semiconductor 25 in the third process chamber 13 by a means of plasma-enhanced chemical vapor deposition (PECVD), and the layer of electron-based silicon semiconductor 26 is used as an electron-based ohmic contact layer; and the conductive metal layer 27 is formed in a pattern on the layer of electron-based silicon semiconductor 26 by a means of physical vapor deposition (PVD), and the conductive metal layer 27 is used as a back electrode, and thereby, a P-I-N structure is achieved.

Similarly, the means of PECVD in the first process chamber 11 is performed using a first plasma source, whereas the first plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz. Similarly, the means of PECVD in the second process chamber 12 is performed using a second plasma source; the second plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz; and the means of PECVD in the third process chamber 13 is performed using a third plasma source; the third plasma source is capable of providing at least one type of plasma; and the first plasma source is a very high frequency (VHF) plasma source, featured by a frequency selected from the group consisting of: 13.56 MHz, 27.12 MHz, 40 MHz and those higher than 40 MHz. Moreover, during the forming of the second layer of intrinsic microcrystalline silicon semiconductor 24 on the first layer of intrinsic microcrystalline silicon semiconductor 23 in the second process chamber 12 using the second plasma source, any defect in the first layer of intrinsic microcrystalline silicon semiconductor 23 is remedied and repaired for enhancing the quality of the resulting microcrystalline thin film. It is noted that the first layer of intrinsic microcrystalline silicon semiconductor 23 not only can be used as a light absorption layer, it can also be used for preventing chamber contamination from happening in the high pressure, high power manufacturing process. In addition, the substrate 20 is a substrate selected from the group consisting of: a glass and a flexible thermal-resistant substrate; and the first process chamber 11 is connected to the second process chamber 12, and the second process chamber 12 is connected to the third process chamber 13, while the third process chamber 13 is connected to a vacuumed load-lock chamber. It is noted that the load-lock chamber is being vacuumed after having a sample disposed therein, and then after to a specific degree of vacuum is reached, the sample is then ready to be transported for processing.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for manufacturing a microcrystalline silicon thin film solar cell, comprising the steps of:
   providing an assembly of chambers connected in serial, comprising a first chamber connected to a second chamber connected to a third chamber connected to a load-lock chamber;
   using physical vapor deposition (PVD) to form a layer of transparent conducting oxide (TCO) and thus define a pattern on a substrate;
   using plasma-enhanced chemical vapor deposition (PECVD) to form a layer of hole-based silicon semiconductor on the layer of TCO in the first process chamber;
   using a first plasma source with a first processing pressure and a first plasma power to form a first portion of a layer of intrinsic microcrystalline silicon semiconductor via PECVD on the layer of hole-based silicon semiconductor in the first process chamber;
   using a second plasma source, distinct from said first plasma source, with a second processing pressure and a second plasma power to form a second portion of said layer of intrinsic microcrystalline silicon semiconductor via PECVD in the second process chamber, wherein said second processing pressure is greater than said first processing pressure and said second plasma power is greater than said first plasma power;
   using a third plasma source, distinct from said first plasma source and said second plasma source, to form a third portion of said layer of intrinsic microcrystalline silicon semiconductor via PECVD in the third process chamber;
   using PECVD to form a layer of electron-based silicon semiconductor, in a pattern on said layer of intrinsic microcrystalline silicon semiconductor in the third process chamber; and
   using PVD to form a conductive metal layer in a pattern on the layer of electron-based silicon semiconductor thereby achieving a P-I-N structure.

2. The manufacturing method of claim 1, wherein the first plasma source is a very high frequency (VHF) plasma source with a frequency selected from the group consisting of: 13.56 MHz, 27.12 MHz, 40 MHz and those higher than 40 MHz.

3. The manufacturing method of claim 2, wherein the second plasma source is a very high frequency (VHF) plasma source with a frequency selected from the group consisting of: 13.56 MHz, 27.12 MHz, 40 MHz and those higher than 40 MHz.

4. The manufacturing method of claim 3, wherein the third plasma source is a very high frequency (VHF) plasma source with a frequency selected from the group consisting of: 27.12 MHz, 40 MHz and those higher than 40 MHz.

5. The manufacturing method of claim 1, wherein during the forming of the second portion of said layer of intrinsic microcrystalline silicon semiconductor in the second process chamber using the second plasma source, any defect in the first portion of said layer of intrinsic microcrystalline silicon semiconductor is remedied and repaired.

6. The manufacturing method of claim 1, wherein the substrate is selected from the group consisting of: a glass and a flexible thermal-resistant substrate.

* * * * *